US007209840B2

(12) United States Patent
Petite et al.

(10) Patent No.: US 7,209,840 B2
(45) Date of Patent: *Apr. 24, 2007

(54) SYSTEMS AND METHODS FOR PROVIDING REMOTE MONITORING OF ELECTRICITY CONSUMPTION FOR AN ELECTRIC METER

(75) Inventors: Thomas D. Petite, Douglasville, GA (US); Richard M. Huff, Conyers, GA (US)

(73) Assignee: Hunt Technologies, LLC, Pequot Lakes, MN (US)

( * ) Notice: Subject to any disclaimer, the term of this patent is extended or adjusted under 35 U.S.C. 154(b) by 83 days.

This patent is subject to a terminal disclaimer.

(21) Appl. No.: 10/955,881

(22) Filed: Sep. 30, 2004

(65) Prior Publication Data

US 2005/0043059 A1    Feb. 24, 2005

Related U.S. Application Data

(63) Continuation of application No. 09/925,393, filed on Aug. 9, 2001, now Pat. No. 6,836,737, which is a continuation-in-part of application No. 09/704,150, filed on Nov. 9, 2000, now Pat. No. 6,891,838.

(60) Provisional application No. 60/224,065, filed on Aug. 9, 2000.

(51) Int. Cl.
*G08C 17/00*    (2006.01)

(52) U.S. Cl. ............................ 702/62; 702/61; 702/188; 340/870.02

(58) Field of Classification Search ............ 702/60–62, 702/124, 122, 187, 188; 340/870.01–870.03, 340/870.11, 637, 3.1, 425.1
See application file for complete search history.

(56) References Cited

U.S. PATENT DOCUMENTS 3,705,385 A    12/1972    Batz ....................... 340/152 R
3,742,142 A    6/1973    Martin ........................ 179/2 A
3,922,492 A    11/1975    Lumsden ..................... 179/2 A
4,124,839 A    11/1978    Cohen ......................... 340/151
4,135,181 A    1/1979    Bogacki et al. ......... 340/310 A
4,204,195 A    5/1980    Bogacki ..................... 340/151

(Continued)

FOREIGN PATENT DOCUMENTS

DE    WO03/007264    1/2003

(Continued)

*Primary Examiner*—Hal Wachsman
(74) *Attorney, Agent, or Firm*—N. Andrew Crain; Thomas, Kayden, Horstemeyer & Risley (57)    ABSTRACT

A system for providing remote monitoring of electricity consumption is provided. In one embodiment the system may comprise electric meters, communication devices having a unique address and defining a wireless communication network, and a site controller. Each electric meter may be configured to measure electricity consumption of a load. Each communication device may be associated with one of the electric meters and configured to receive electricity consumption data and generate a transmit message using a predefined communication protocol being implemented by the wireless communication network. The transmit message may comprise the unique identifier and electricity consumption data. The site controller may be configured for communication with the wireless communication network and configured to receive the transmit message from one of the communication devices, identify the electric meter associated with the transmit message, and provide information related to the transmit message to a WAN for delivery to a computer.

22 Claims, 7 Drawing Sheets

U.S. PATENT DOCUMENTS

| | | | |
|---|---|---|---|
| 4,213,119 A | 7/1980 | Ward et al. | 340/151 |
| 4,396,915 A | 8/1983 | Farnsworth et al. | 340/870.03 |
| 4,417,450 A | 11/1983 | Morgan, Jr. et al. | 62/126 |
| 4,488,152 A | 12/1984 | Arnason et al. | 340/870.37 |
| 4,621,263 A | 11/1986 | Takenaka et al. | 340/870.07 |
| 4,697,166 A | 9/1987 | Warnagiris et al. | 340/310 |
| 4,742,296 A | 5/1988 | Petr et al. | 324/142 |
| 4,799,059 A | 1/1989 | Grindahl et al. | 340/870.03 |
| 4,875,231 A | 10/1989 | Hara et al. | 379/61 |
| 4,908,769 A | 3/1990 | Vaughan et al. | 364/464.04 |
| 4,918,690 A | 4/1990 | Markkula, Jr. et al. | 370/94 |
| 4,918,995 A | 4/1990 | Pearman et al. | 73/861.02 |
| 4,940,976 A | 7/1990 | Gastouniotis et al. | 340/870.02 |
| 4,962,496 A | 10/1990 | Vercellotti et al. | 370/11 |
| 4,968,970 A | 11/1990 | LaPorte | 340/310 |
| 4,973,957 A | 11/1990 | Shimizu et al. | 340/825.52 |
| 4,980,907 A | 12/1990 | Raith et al. | 379/63 |
| 4,989,230 A | 1/1991 | Gillig et al. | 379/59 |
| 5,032,833 A | 7/1991 | Laporte | 340/825.02 |
| 5,053,766 A | 10/1991 | Ruiz-del-Portal et al. | 340/870.02 |
| 5,115,224 A | 5/1992 | Kostusiak et al. | 340/574 |
| 5,124,624 A | 6/1992 | de Vries et al. | 324/142 |
| 5,128,855 A | 7/1992 | Hilber et al. | 364/132 |
| 5,134,650 A | 7/1992 | Blackmon | 379/107 |
| 5,136,285 A | 8/1992 | Okuyama | 340/870.11 |
| 5,155,481 A | 10/1992 | Brennan, Jr. et al. | 340/870.02 |
| 5,191,326 A | 3/1993 | Montgomery | 340/855.5 |
| 5,193,111 A | 3/1993 | Matty et al. | 379/106 |
| 5,197,095 A | 3/1993 | Bonnet et al. | 379/107 |
| 5,212,645 A | 5/1993 | Wildes et al. | 700/107 |
| 5,239,575 A | 8/1993 | White et al. | 379/107 |
| 5,243,338 A | 9/1993 | Brennan, Jr. et al. | 340/870.02 |
| 5,245,633 A | 9/1993 | Schwartz et al. | 375/100 |
| 5,252,967 A | 10/1993 | Brennan et al. | 340/870.02 |
| 5,331,318 A | 7/1994 | Montgomery | 340/855.4 |
| 5,355,513 A | 10/1994 | Clarke et al. | 455/20 |
| 5,371,736 A | 12/1994 | Evan | 370/79 |
| 5,412,760 A | 5/1995 | Peitz | 370/95.1 |
| 5,416,475 A | 5/1995 | Tolbert et al. | 340/870.02 |
| 5,432,507 A | 7/1995 | Mussino et al. | 340/870.03 |
| 5,438,329 A | 8/1995 | Gastouniotis | 340/870.02 |
| 5,439,414 A | 8/1995 | Jacob | 434/61 |
| 5,442,553 A | 8/1995 | Parrillo | 364/424.04 |
| 5,451,938 A | 9/1995 | Brennan, Jr. | 340/870.14 |
| 5,467,074 A | 11/1995 | Pedtke | 340/539 |
| 5,471,190 A | 11/1995 | Zimmermann | 340/310 |
| 5,473,322 A | 12/1995 | Carney | 340/870.02 |
| 5,475,689 A | 12/1995 | Kay et al. | 370/95.3 |
| 5,481,259 A | 1/1996 | Bane | 340/870.03 |
| 5,493,287 A | 2/1996 | Bane | 340/825.52 |
| 5,506,837 A | 4/1996 | Söllner et al. | 370/31 |
| 5,509,073 A | 4/1996 | Monnin | 380/20 |
| 5,513,244 A | 4/1996 | Joao et al. | 379/58 |
| 5,528,215 A | 6/1996 | Siu et al. | 340/286.01 |
| 5,541,938 A | 7/1996 | Di Zenzo et al. | 340/870.14 |
| 5,542,100 A | 7/1996 | Hatakeyama | 455/56.1 |
| 5,553,094 A | 9/1996 | Johnson et al. | 375/200 |
| 5,562,537 A | 10/1996 | Zver et al. | 454/61 |
| 5,573,181 A | 11/1996 | Ahmed | 236/49.3 |
| 5,590,179 A | 12/1996 | Shincovich et al. | 379/107 |
| 5,594,431 A | 1/1997 | Sheppard et al. | 340/870.02 |
| 5,602,843 A | 2/1997 | Gray | 370/338 |
| 5,604,414 A | 2/1997 | Milligan et al. | 318/632 |
| 5,608,786 A | 3/1997 | Gordon | 379/100 |
| 5,619,192 A | 4/1997 | Ayala | 340/870.02 |
| 5,629,875 A | 5/1997 | Adair, Jr. | 364/571.03 |
| 5,659,303 A | 8/1997 | Adair, Jr. | 340/870 |
| 5,684,472 A | 11/1997 | Bane | 340/870.02 |
| 5,712,980 A | 1/1998 | Beeler et al. | 395/200 |
| 5,717,718 A | 2/1998 | Rowsell et al. | 375/260 |
| 5,736,965 A | 4/1998 | Mosebrook et al. | 343/702 |
| 5,748,104 A | 5/1998 | Argyroudis et al. | 340/870.11 |
| 5,771,274 A | 6/1998 | Harris | 379/26 |
| 5,774,052 A | 6/1998 | Hamm et al. | 340/540 |
| 5,781,143 A | 7/1998 | Rossin | 341/173 |
| 5,790,662 A | 8/1998 | Valerij et al. | 380/2 |
| 5,796,727 A | 8/1998 | Harrison et al. | 370/338 |
| 5,801,643 A | 9/1998 | Williams et al. | 340/870.02 |
| 5,822,273 A | 10/1998 | Bary et al. | 367/77 |
| 5,842,976 A | 12/1998 | Williamson | 600/300 |
| 5,845,230 A | 12/1998 | Lamberson | 702/56 |
| 5,852,658 A | 12/1998 | Knight et al. | 379/106.03 |
| 5,854,994 A | 12/1998 | Canada et al. | 702/56 |
| 5,864,772 A | 1/1999 | Alvarado et al. | 702/9 |
| 5,874,903 A * | 2/1999 | Shuey et al. | 340/870.02 |
| 5,880,677 A | 3/1999 | Lestician | 340/3.1 |
| 5,884,184 A | 3/1999 | Sheffer | 455/521 |
| 5,892,758 A * | 4/1999 | Argyroudis | 370/335 |
| 5,896,097 A | 4/1999 | Cardozo | 340/870.03 |
| 5,897,607 A | 4/1999 | Jenney et al. | 702/62 |
| 5,907,291 A | 5/1999 | Chen et al. | 340/870.16 |
| 5,907,491 A | 5/1999 | Canada et al. | 364/468.15 |
| 5,914,672 A * | 6/1999 | Glorioso et al. | 340/870.02 |
| 5,914,673 A | 6/1999 | Jennings et al. | 340/870.03 |
| 5,917,405 A | 6/1999 | Joao | 340/426 |
| 5,923,269 A | 7/1999 | Shuey et al. | 340/870.02 |
| 5,933,073 A | 8/1999 | Shuey | 340/310.07 |
| 5,953,371 A | 9/1999 | Rowsell et al. | 375/220 |
| 5,959,550 A | 9/1999 | Giles | 340/870.02 |
| 5,963,146 A | 10/1999 | Johnson et al. | 340/870.01 |
| 5,963,452 A | 10/1999 | Etoh et al. | 364/479.06 |
| 5,963,650 A | 10/1999 | Simionescu et al. | 380/49 |
| 5,978,371 A | 11/1999 | Mason, Jr. et al. | 370/389 |
| 5,986,574 A | 11/1999 | Colton | 340/870.02 |
| 5,991,639 A | 11/1999 | Rautiola et al. | 455/553 |
| 5,995,806 A | 11/1999 | Tsubouchi et al. | 455/38.2 |
| 6,005,759 A | 12/1999 | Hart et al. | 361/66 |
| 6,023,223 A | 2/2000 | Baxter, Jr. | 340/531 |
| 6,028,522 A | 2/2000 | Petite | 340/641 |
| 6,028,857 A | 2/2000 | Poor | 370/351 |
| 6,035,266 A | 3/2000 | Williams et al. | 702/188 |
| 6,044,062 A | 3/2000 | Brownrigg et al. | 370/238 |
| 6,060,994 A | 5/2000 | Chen | 340/521 |
| 6,061,604 A | 5/2000 | Russ et al. | 700/90 |
| 6,073,169 A | 6/2000 | Shuey et al. | 709/217 |
| 6,078,785 A | 6/2000 | Bush | 455/7 |
| 6,087,957 A | 7/2000 | Gray | 340/825.54 |
| 6,088,659 A | 7/2000 | Kelley et al. | 702/62 |
| 6,094,622 A | 7/2000 | Hubbard et al. | 702/61 |
| 6,100,817 A | 8/2000 | Mason, Jr. et al. | 340/870.02 |
| 6,101,427 A | 8/2000 | Yang | 700/241 |
| 6,101,445 A | 8/2000 | Alvarado et al. | 702/9 |
| 6,119,076 A | 9/2000 | Williams et al. | 702/188 |
| 6,137,423 A | 10/2000 | Glorioso et al. | 340/870.2 |
| 6,150,936 A | 11/2000 | Addy | 340/539 |
| 6,150,955 A | 11/2000 | Tracy et al. | 340/870.02 |
| 6,172,616 B1 | 1/2001 | Johnson et al. | 340/870.12 |
| 6,177,883 B1 | 1/2001 | Jennetti et al. | 340/870.02 |
| 6,192,390 B1 | 2/2001 | Berger et al. | 709/200 |
| 6,195,018 B1 | 2/2001 | Ragle et al. | 340/870.01 |
| 6,199,068 B1 | 3/2001 | Carpenter | 707/100 |
| 6,218,953 B1 | 4/2001 | Petite | 340/641 |
| 6,218,983 B1 | 4/2001 | Kerry et al. | 342/149 |
| 6,236,332 B1 | 5/2001 | Conkright et al. | 340/825.06 |
| 6,243,010 B1 | 6/2001 | Addy et al. | 340/539 |
| 6,246,677 B1 * | 6/2001 | Nap et al. | 370/346 |
| 6,249,516 B1 | 6/2001 | Brownrigg et al. | 370/338 |
| 6,259,369 B1 | 7/2001 | Monico | 340/572.8 |
| 6,301,514 B1 | 10/2001 | Canada et al. | 700/108 |
| 6,305,602 B1 | 10/2001 | Grabowski et al. | 235/379 |
| 6,308,111 B1 | 10/2001 | Koga | 700/236 |
| 6,317,029 B1 | 11/2001 | Fleeter | 340/10.32 |
| 6,333,975 B1 * | 12/2001 | Brunn et al. | 379/106.03 |

| | | | |
|---|---|---|---|
| 6,351,223 B1* | 2/2002 | DeWeerd et al. | 340/870.03 |
| 6,357,034 B1 | 3/2002 | Muller et al. | 714/784 |
| 6,363,057 B1 | 3/2002 | Ardalan et al. | 370/252 |
| 6,366,217 B1 | 4/2002 | Cunningham et al. | 340/870.31 |
| 6,370,489 B1 | 4/2002 | Williams et al. | 702/188 |
| 6,373,399 B1 | 4/2002 | Johnson et al. | 340/870.11 |
| 6,380,851 B1 | 4/2002 | Gilbert et al. | 340/517 |
| 6,384,722 B1 | 5/2002 | Williams | 340/506 |
| 6,393,341 B1 | 5/2002 | Lawrence et al. | 700/286 |
| 6,393,381 B1 | 5/2002 | Williams et al. | 702/188 |
| 6,393,382 B1 | 5/2002 | Williams et al. | 702/188 |
| 6,396,839 B1 | 5/2002 | Ardalan et al. | 370/401 |
| 6,401,081 B1 | 6/2002 | Montgomery et al. | 705/63 |
| 6,415,245 B2 | 7/2002 | Williams et al. | 702/188 |
| 6,424,270 B1 | 7/2002 | Ali | 340/870.02 |
| 6,424,931 B1 | 7/2002 | Sigmar et al. | 702/188 |
| 6,437,692 B1 | 8/2002 | Petite et al. | 340/540 |
| 6,445,291 B2 | 9/2002 | Addy et al. | 340/539 |
| 6,456,960 B1 | 9/2002 | Williams et al. | 702/188 |
| 6,457,038 B1 | 9/2002 | Defosse | 709/200 |
| 6,462,672 B1 | 10/2002 | Besson | 340/853.2 |
| 6,477,558 B1 | 11/2002 | Irving et al. | 709/100 |
| 6,483,290 B1 | 11/2002 | Hemminger et al. | 324/142 |
| 6,489,884 B1 | 12/2002 | Lamberson et al. | 340/7.2 |
| 6,492,910 B1 | 12/2002 | Ragle et al. | 340/870.02 |
| 6,504,357 B1 | 1/2003 | Hemminger et al. | 324/142 |
| 6,507,794 B1 | 1/2003 | Hubbard et al. | 702/60 |
| 6,519,509 B1* | 2/2003 | Nierlich et al. | 700/286 |
| 6,519,568 B1 | 2/2003 | Harvey et al. | 705/1 |
| 6,538,577 B1* | 3/2003 | Ehrke et al. | 340/870.02 |
| 6,542,076 B1 | 4/2003 | Joao | 340/539 |
| 6,542,077 B2 | 4/2003 | Joao | 340/539 |
| 6,543,690 B2 | 4/2003 | Leydier et al. | 235/451 |
| 6,653,945 B2 | 11/2003 | Johnson et al. | 340/870.02 |
| 6,657,552 B2* | 12/2003 | Belski et al. | 340/870.02 |
| 6,747,981 B2 | 6/2004 | Ardalan et al. | 370/401 |
| 6,816,538 B2 | 11/2004 | Shuey et al. | 375/136 |
| 6,836,737 B2* | 12/2004 | Petite et al. | 702/62 |
| 6,885,309 B1* | 4/2005 | Van Heteren | 340/870.11 |
| 2001/0024163 A1 | 9/2001 | Petite | 340/628 |
| 2001/0024165 A1* | 9/2001 | Steen et al. | 340/870.01 |
| 2001/0038343 A1* | 11/2001 | Meyer et al. | 340/870.02 |
| 2002/0002444 A1 | 1/2002 | Williams et al. | 702/188 |
| 2002/0013679 A1 | 1/2002 | Petite | 702/188 |
| 2002/0019725 A1 | 2/2002 | Petite | 702/188 |
| 2002/0089428 A1 | 7/2002 | Walden et al. | 340/870.02 |
| 2002/0109607 A1* | 8/2002 | Cumeralto et al. | 340/870.02 |
| 2002/0158774 A1 | 10/2002 | Johnson et al. | 340/870.02 |
| 2002/0161536 A1* | 10/2002 | Suh et al. | 702/62 |
| 2002/0163442 A1 | 11/2002 | Fischer | 340/870.02 |
| 2002/0193144 A1 | 12/2002 | Belski et al. | 455/557 |
| 2003/0001754 A1 | 1/2003 | Johnson et al. | 340/870.02 |
| 2003/0030926 A1 | 2/2003 | Aguren et al. | 360/6 |
| 2003/0034900 A1 | 2/2003 | Han | 340/870.02 |

FOREIGN PATENT DOCUMENTS

| | | |
|---|---|---|
| EP | 0718954 | 6/1996 |
| EP | 0825577 | 2/1998 |
| EP | 1096454 | 2/2001 |
| FR | 2766600 | 1/1999 |
| FR | 2817110 | 5/2002 |
| GB | 2229302 A | 9/1990 |
| GB | 2262683 | 6/1993 |
| GB | 2297663 | 3/1995 |
| GB | 2310779 | 9/1997 |
| GB | 2336272 | 4/1998 |
| GB | 2326002 | 12/1998 |
| GB | 2352004 | 1/2001 |
| GB | 2352044 | 1/2001 |
| GB | 2352590 | 1/2001 |
| JP | 60261288 A | 12/1985 |
| JP | 1255100 A | 10/1989 |
| JP | 12551100 | 10/1989 |
| JP | 11353573 | 12/1999 |
| JP | 20001133509 | 4/2000 |
| JP | 200207672 | 7/2000 |
| JP | 200285354 | 10/2000 |
| JP | 2001309069 | 11/2001 |
| JP | 20011319284 | 11/2001 |
| JP | 2001357483 | 12/2001 |
| JP | 2002171354 | 6/2002 |
| KR | 2001025431 | 4/2001 |
| WO | WO9013197 A1 | 11/1990 |
| WO | WO98/00056 | 1/1998 |
| WO | WO98/37528 | 8/1998 |
| WO | WO99/13426 | 3/1999 |
| WO | WO01/15114 | 3/2001 |
| WO | WO01/24109 | 4/2001 |
| WO | WO02/08725 | 1/2002 |
| WO | WO02/08866 | 1/2002 |
| WO | WO02/052521 | 7/2002 |
| WO | WO03/021877 | 3/2003 |

* cited by examiner

FIG. 5 Message Structure

| To Addr. (1-6) | From Addr. (6) | Pkt. No. (1) | Pkt. Max. (1) | Pkt. Lngth. (1) | Msg. Num. (1) | Cmd. (1) | Data (0-109) | CkH (1) | CkL (1) |
|---|---|---|---|---|---|---|---|---|---|
| 500 | 510 | 520 | 530 | 540 | 550 | 560 | 570 | 580 | 590 |

SYSTEMS AND METHODS FOR PROVIDING REMOTE MONITORING OF ELECTRICITY CONSUMPTION FOR AN ELECTRIC METER

CROSS-REFERENCE TO RELATED APPLICATION

This application is a continuation of U.S. patent application Ser. No. 0/925,393, filed Aug. 9, 2001, entitled "Systems and Methods for Providing Remote Electricity Consumption for an Electric Meter," which has issued as U.S. Pat. No. 6,836,737 and which is hereby incorporated by reference in its entirety. U.S. patent application Ser. No. 09/925,393 was a continuation-in-part of U.S. patent application Ser. No. 09/704,150, which was filed on Nov. 9, 2000 and has issued as U.S. Pat. No. 6,891,838. Also, U.S. patent application Ser. No. 09/925,393 claimed the benefit of provisional application No. 60/224,065, filed Aug. 9, 2000.

FIELD OF THE INVENTION

The present invention generally relates to remotely operated systems, and more particularly to systems and methods for providing remote monitoring of electricity consumption for an electric meter.

BACKGROUND

There are a variety of systems for monitoring and/or controlling any of a number of systems and/or processes, such as, for example, manufacturing processes, inventory systems, emergency control systems, personal security systems, residential systems, and electric utility meters to name a few. In many of these "automated monitoring systems," a host computer in communication with a wide area network monitors and/or controls a plurality of remote devices arranged within a geographical region. The plurality of remote devices typically use remote sensors and controllers to monitor and respond to various system parameters to reach desired results. A number of automated monitoring systems use computers or dedicated microprocessors in association with appropriate software to process system inputs, model system responses, and control actuators to implement corrections within a system.

Various schemes have been proposed to facilitate communication between the host computer and the remote devices within the system, including RF transmission, light transmission (including infra-red), and control signal modulation over the local power distribution network. For example, U.S. Pat. No. 4,697,166 to Warnagiris et al. describes a power-line carrier backbone for inter-element communications. As recognized in U.S. Pat. No. 5,471,190 to Zimmerman, there is a growing interest in home automation systems and products that facilitate such systems. One system, critically described in the Zimmerman patent, is the X-10 system. Recognizing that consumers will soon demand interoperability between household systems, appliances, and computing devices, the Electronics Industry Association (EIA) has adopted an industry standard, known as the Consumer Electronics Bus (CEBus). The CEBus is designed to provide reliable communications between suitably configured residential devices through a multi-transmission media approach within a single residence.

One problem with expanding the use of automated monitoring system technology to distributed systems is the cost associated with developing the local sensor-actuator infrastructure necessary to interconnect the various devices. A typical approach to implementing this technology is to install a local network of hard-wired sensors and actuators along with a local controller. Not only is there expense associated with developing and installing appropriate sensors and actuators, but the added expense of connecting functional sensors and actuators with the local controller is also problematic. Another prohibitive cost is the expense associated with the installation and operational expense associated with programming the local controller.

Another problem with expanding the use of automated monitoring system technology is the cost of the sensor/actuator infrastructure required to monitor and control such systems. The typical approach to implementing an automated monitoring system includes installing a local network of hard-wired sensor(s)/actuator(s) and a site controller. There are expenses associated with developing and installing the appropriate sensor(s)/actuator(s) and connecting functional sensor(s)/actuator(s) with the local controller. Another prohibitive cost of such is the installation and operational expenses associated to the local controller.

Furthermore, it is difficult to use existing automated monitoring systems to monitor electricity consumption. Currently, a residential homeowner and/or a commercial user cannot easily and inexpensively determine their electricity consumption remotely. Currently available systems have prohibitive costs as well as complicated installation and maintenance requirements.

Accordingly, there is a need for monitoring and control systems that overcome the shortcomings of the prior art.

SUMMARY OF THE INVENTION

The present invention is generally directed to a cost-effective automated monitoring system and method for providing remote monitoring of electricity consumption for an electric meter via a host computer connected to a communication network, such as a wide area network. The automated monitoring system may include one or more electric meters to be read and/or controlled, ultimately, through a remote applications server via a site controller. The remote applications server and the site controller may communicate via a communication network, such as a wide area network. The electric meters are in communication with communication devices, which may be wireless, that transmit and/or receive encoded data and control signals to and from the site controller. The automated monitoring system also includes a plurality of signal repeaters that may relay information between the communication devices disposed in connection with the electric meters and the site controller.

The present invention may be viewed as providing a communication device adapted for use in an automated monitoring system for providing remote monitoring of electricity consumption. The automated monitoring system may comprise a site controller in communication with a plurality of electric meters via a wireless communication network. The site controller may also be in communication with a host computer via a wide area network. Briefly described, in one embodiment the communication device may comprise a data interface, memory, logic, and a wireless transceiver. The data interface may be configured to receive data related to the electricity consumption of an electric meter. The memory may comprise a unique identifier corresponding to the electric meter. The logic may be configured to receive the data related to the electricity consumption of the electric meter, retrieve the unique identifier corresponding to the electric meter, and generate a transmit message using a predefined communication protocol being implemented by the wireless communication network. The transmit message may comprise the unique identifier and the data related to the electricity consumption of the electric meter. The transmit signal may also be configured such that the transmit message may be received by the site controller via the wireless communication network and such that the site controller may identify the electric meter and notify the host computer of the transmit message. The wireless transceiver may be configured for communication over the wireless communication network and configured to provide the transmit signal to the wireless communication network and receive messages from the wireless communication network.

The present invention may also be viewed as a device for measuring electricity consumption. The device may be adapted for use in an automated monitoring system for providing remote monitoring of electricity consumption. The automated monitoring system may comprise a site controller in communication with a plurality of electric meters via a wireless communication network. The site controller may also be in communication with a host computer via a wide area network. Briefly described, in one embodiment the device comprises an electric meter, a data interface, a memory, logic, and a wireless transceiver. The electric meter may be configured for measuring the electricity consumption of a load associated with the device. The data interface may be configured to receive data related to the electricity consumption of the device. The memory may comprise a unique identifier corresponding to the electric meter. The logic may be configured to receive the data related to the electricity consumption of the electric meter, retrieve the unique identifier corresponding to the electric meter, and generate a transmit message using a predefined communication protocol being implemented by the wireless communication network. The transmit message may comprise the unique identifier and the data related to the electricity consumption of the electric meter. The transmit message may be configured such that the transmit message may be received by the site controller via the wireless communication network and such that the site controller may identify the electric meter and notify the host computer of the transmit message. The wireless transceiver may be configured for communication over the wireless communication network and configured to provide the transmit signal to the wireless communication network and receive messages from the wireless communication network.

The present invention may also be viewed as providing a system for providing remote monitoring of electricity consumption. Briefly described, in one embodiment the system may comprise a plurality of electric meters, a plurality of communication devices having a unique address and defining a wireless communication network, and a site controller. Each of the plurality of electric meters may be configured to measure the electricity consumption of a load attached to the electric meter. Each of the plurality of communication devices may be associated with one of the plurality of electric meters and configured to receive data related to the electricity consumption of the electric meter and generate a transmit message using a predefined communication protocol being implemented by the wireless communication network. The transmit message may comprise the unique identifier and the data related to the electricity consumption of the electric meter. The site controller may be configured for communication with the wireless communication network and configured to receive the transmit message from one of the plurality of communication devices, identify the electric meter associated with the transmit message, and provide information related to the transmit message to a wide area network for delivery to a host computer.

BRIEF DESCRIPTION OF THE DRAWINGS

The accompanying drawings incorporated in and forming a part of the specification, illustrate several aspects of the present invention, and together with the description serve to explain the principles of the invention. In the drawings.

DETAILED DESCRIPTION OF THE PREFERRED EMBODIMENT

Having summarized the invention above, reference is now made in detail to the description of the invention as illustrated in the drawings.

While the invention will be described in connection with these drawings, there is no intent to limit it to the embodiment or embodiments disclosed therein. On the contrary, the intent is to cover all alternatives, modifications and equivalents included within the spirit and scope of the invention as defined by the appended claims.

Figure 1:
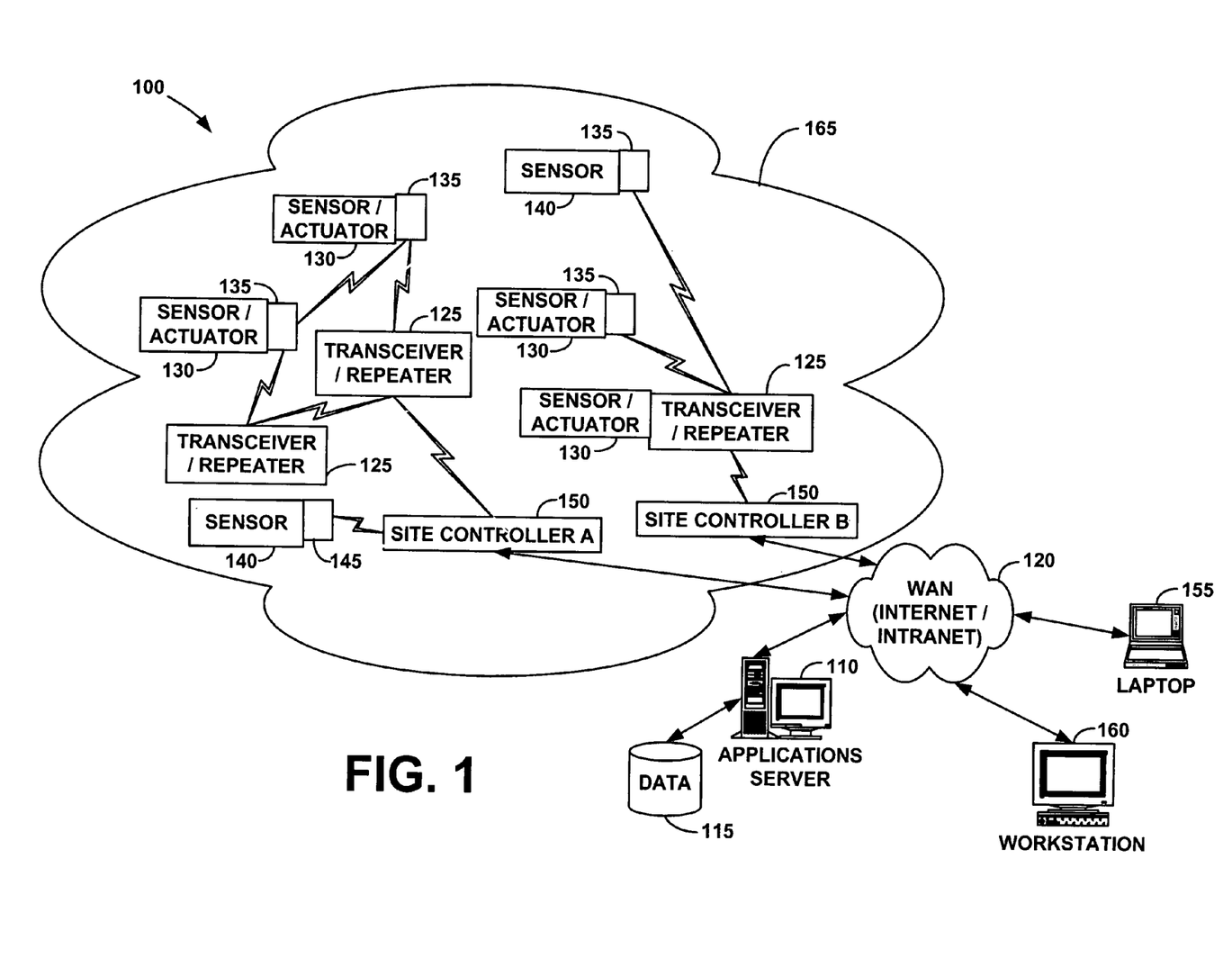
FIG. 1 is a block diagram illustrating one of a number of embodiments for an automated monitoring system according to the present invention for providing remote monitoring of electricity consumption for an electric meter.

FIG. 1 sets forth a block diagram that illustrates one of a number of embodiments of an automated monitoring system 100 according to the present invention. Automated monitoring system 100 may comprise an applications server 110, one or more site controllers 150, and a series of remote devices, such as sensors 140 and sensors/actuators 130. The applications server 110 may communicate with a user via a laptop 155, workstation 160, etc. One or more site controllers 150 and the applications server 110 may communicate via one or more communication networks, such as a wide area network (WAN) 120 or other suitable communication network. The site controller 150 may communicate with the remote devices via a plurality of transceivers. The remote devices may be one of many devices that include a sensor, actuator, etc. As described in detail below, in one embodiment, the sensors 140 may be a plurality of electric meters, in which case automated monitoring system 100 may enable users to remotely monitor the electricity consumption associated with one of the electric meters.

As illustrated in FIG. 1, transceivers 135 may be integrated with a sensor 140 or a sensor/actuator 130. Transceivers 135 may be wireless transceivers, such as RF transceivers, that are relatively small in size and that transmit a relatively low power RF signal. In some embodiments, the transmission range of a transceiver 135 may be relatively limited, which can be a desirable characteristic of automated monitoring system 100. Although the transceivers 135 are depicted without user interfaces such as a keypad (not shown), the transceivers 135 may be configured with user selectable buttons or an alphanumeric keypad (not shown). Transceivers 135 may be electrically interfaced with a sensor/actuator 130, such as a smoke detector, a thermostat, a security system, etc., where external buttons are not needed.

Automated monitoring system 100 may include a plurality of stand-alone transceivers 125. Each of the stand-alone transceivers 125 and each of the integrated transceivers 135 may receive an incoming RF transmission and transmit an outgoing signal. This outgoing signal may be another low power RF transmission signal, a higher power RF transmission signal, or, as in alternative embodiments, may be transmitted over a conductive wire, a fiber optic cable, or other transmission media. One or ordinary skill in the art will appreciate that, if an integrated transceiver 135 is located sufficiently close to the site controller 150 such that the outgoing signal of the integrated transceiver 135 may be received by a site controller 150, the outgoing signal need not be processed and repeated through one of the stand-alone transceivers 125.

Stand-alone transceivers 125 act as repeaters within the automated monitoring system 100. In operation, the stand-alone transceiver 125 receives an incoming message and transmits an ongoing message comprising the incoming message. The stand-alone transceiver 125 enables the automated monitoring system 100 to be geographically larger without any increases in transmission power, sensitivity, etc. In addition, as described below, an integrated transceiver 135 may function as both an integrated transceiver and a repeater.

One of ordinary skill in the art will appreciate that a variety of types of transceivers may be used. For example, one RF transceiver that may be used is the TR1000, manufactured by RF Monolithics, Inc. The TR1000 hybrid transceiver is well suited for short range, wireless data applications where robust operation, small size, low power consumption, and low-cost are desired. All critical RF functions may be performed within a single hybrid semiconductor chip, simplifying circuit design and accelerating the design-in process. The receiver section of the TR1000 is sensitive and stable. A wide dynamic range log detector, in combination with digital automatic gain control (AGC), may provide robust performance in the presence of channel noise or interference. Two stages of surface acoustic wave (SAW) filtering may provide excellent receiver out-of-band rejection. The transmitter section of the TR1000 may also include provisions for both on-off keyed (OOK) and amplitude-shift key (ASK) modulation. The transmitter may employ SAW filtering to suppress output harmonics.

Additional details of the TR1000 transceiver need not be described herein, because the present invention is not limited by the particular choice of transceiver. Indeed, numerous RF transceivers may be implemented in accordance with the teachings of the present invention. Transceivers may include other 900 MHz transceivers, as well as transceivers at other frequencies. In addition, infrared, ultrasonic, and other types of wireless transceivers may be employed, consistent with the broad scope of the present invention.

The site controllers 150 may send and receive remote data transmissions from one or more of the stand-alone transceivers 125 or one or more of the integrated transceivers 135. The site controller 150 may also analyze the transmissions received, convert the transmissions into transfer control protocol/Internet protocol (TCP/IP) format, and further communicate the remote data signal transmissions to the applications server 110 via the WAN 120. The site controller 150 may communicate information, service requests, control signals, etc. to the integrated transceivers 135 from the applications server 110, the laptop computer 155, and/or the workstation 160 across the WAN 120. The applications server 110 may be further networked with a database 115 configured to record client specific data. Further information regarding the various ways in which site controller 150 and applications server 110 may communicate can be found in the commonly assigned U.S. Pat. No. 6,891,838 entitled "System and Method for Monitoring and Controlling Residential Devices," and filed Nov. 1, 2000, which is hereby incorporated by reference in its entirety.

As shown in FIG. 1, the automated monitoring system 100 may use one or more site controllers 150. In embodiments where multiple site controllers 150 are implemented, redundant site controllers 150 may function as a back-up site controller 150 in case a primary site controller 150 fails. Redundant site controllers 150 may be employed to expand the capacity of the automated monitoring system 100. Additional information regarding the architecture, functionality, and operation of the site controller 150 may be found in commonly assigned U.S. patent application Ser. No. 09/925,786 "System and Method for Controlling Communication Between a Host Computer and Communication Devices Associated with Remote Devices in an Automated Monitoring System".

It will be further appreciated that the automated monitoring system 100 in accordance with the present invention may be used in a variety of environments. For example, in one embodiment, automated monitoring system 100 may be employed to monitor and record electricity consumption by residential and industrial customers. In this manner, automated monitoring system 100 may enable the residential and industrial customers to monitor the electricity consumption for their electric meter. One of ordinary skill in the art will appreciate that automated monitoring system 100 may also be employed to transfer vehicle diagnostics from an automobile via an RE transceiver integrated with a vehicle diagnostics bus to a local transceiver, which further transmits the vehicle information through a site controller 150 onto a WAN 120. Automated monitoring system 100 may also be used to monitor and control an irrigation system, to automate a parking facility, etc. as described in commonly assigned U.S. Pat. No. 6,891,838, entitled, "System and Method for Monitoring and Controlling Residential Devices," and filed Nov. 1, 2000, which is hereby incorporated in its entirety by reference.

The integrated transceivers 135 may have substantially identical construction (particularly with regard to their internal electronics), which may provide a cost-effective implementation for automated monitoring system 100. One of ordinary skill in the art will appreciate that automated monitoring system 100 may also implement any of a variety of types of transceivers depending on design needs. Furthermore, a plurality of stand-alone transceivers 125 may be disposed in such a way that adequate RF coverage is provided between transceivers associated with sensors 140 and sensors/actuators 130 and the site controller 150. For example, without stand-alone transceivers 125, certain sensors 140 and sensors/actuators 130 may be arranged within automated monitoring system 100 such that the associated transceiver is not in communication with either the site controller 150 or another transceiver in communication with the site controller 150. In these situations, stand-alone transceivers 125 may be arranged such that the stand-alone transceiver is in communication with the transceiver associated with the sensors 140 and sensors/actuators 130 and in communication with site controller 150 or another transceiver in communication with the transceiver associated with the sensors 140 and sensors/actuators 130. In this manner, stand-alone transceivers 125 provide communication throughout coverage area 165 for all devices in automated monitoring system 100.

In certain embodiments of automated monitoring system 100, two or more stand-alone transceivers 125, may pick up a single transmission. Thus, the site controller 150 may receive multiple versions of the same message generated by an integrated transceiver 135, each repeated from different stand-alone transceivers 125. The site controller 150 may utilize these multiple identical messages to triangulate or otherwise more particularly assess the location from which the common message is originating. As described in detail below, automated monitoring system 100 may employ a message protocol in which each transceiver has a unique transmitting device identifier. When transmitting a signal, the transceiver may incorporate the corresponding transmitting device identifier within the transmitted message. In this manner, duplicative transmissions received by the site controller 150 may be ignored or otherwise appropriately handled.

In one embodiment, the site controller 150 may collect, format, and store client specific data from each of the integrated transceivers 135 for later retrieval or access by the applications server 110. The site controller 150 may be in communication with applications server 110, laptop computer 155, workstation 160, or any other computing device via WAN 120. Applications server 110 may be configured to host application specific software. In this regard, the workstation 160 or the laptop 155 may be used to access the information stored at the applications server 110 through, for example, a Web browser or using other known methods. In another embodiment, the applications server 110 may perform the additional functions of hosting application specific control system functions. In a third embodiment, clients may elect, for proprietary reasons, to host control applications on their own workstation connected to WAN 120. In this regard, the database 115 and the applications server 110 may act solely as a data collection and reporting device with the client workstation 160 generating control signals for the automated monitoring system. Further information can be found in the commonly assigned U.S. Pat. No. 6,891,838 entitled, "System and Method for Monitoring and Controlling Residential Devices," and filed Nov. 1, 2000, which is hereby incorporated by reference in its entirety.

Figure 3:
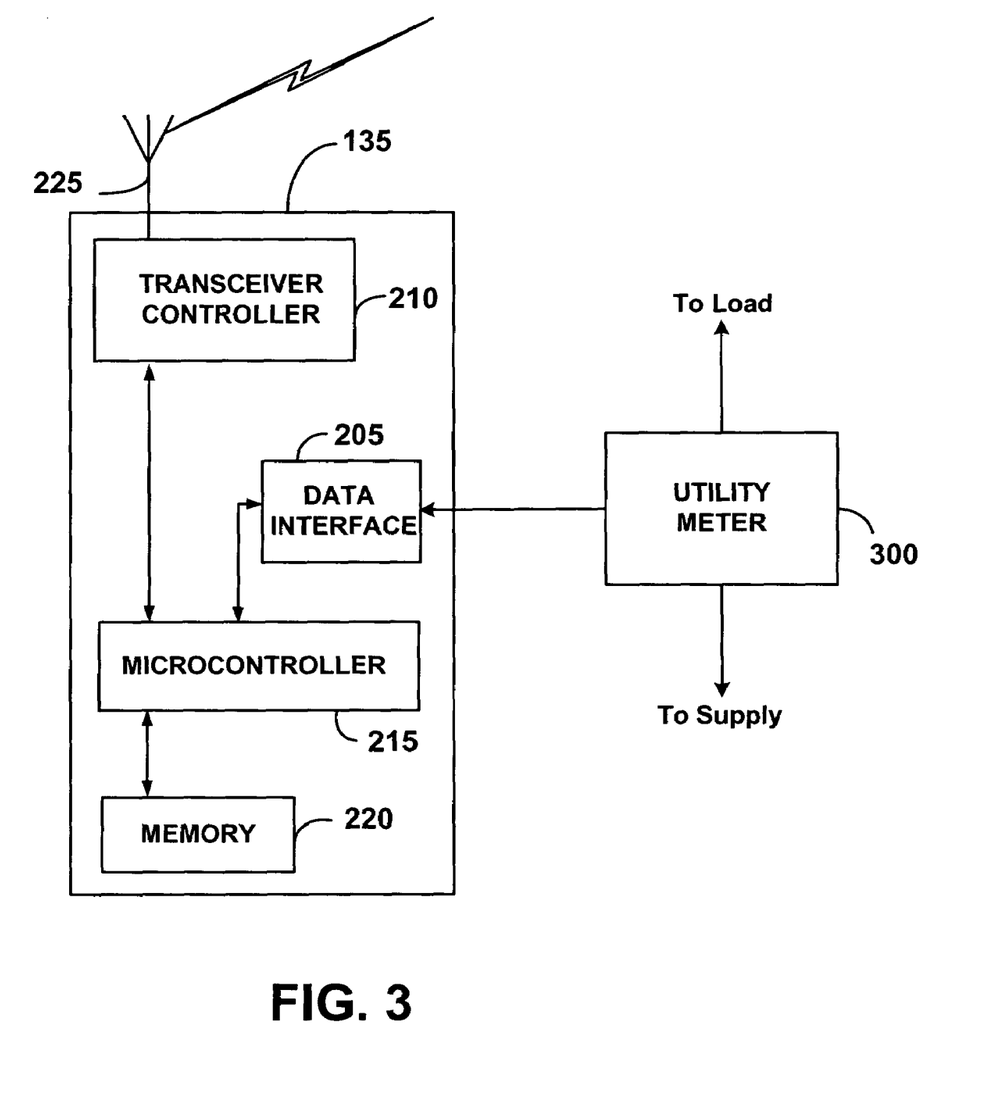
FIG. 3 is a block diagram illustrating one of a number of embodiments of an electric meter device in communication with the transceiver of FIG. 1 according to the present invention.

Reference is now made to FIG. 3, which is a block diagram illustrating a transceiver 135 that may be integrated with a sensor 130. As stated above, the characteristics of sensor 130 may vary depending on the environment in which automated monitoring system 100 is implemented. For example, the sensor 130 may be a two-state device such as a smoke alarm, a thermometer, a utility meter, a personal security system controller, or any other sensor. Regardless the specific characteristics of sensor 130, transceiver 135 may include a data interface 305 configured to receive and/or transmit signal to sensor 130. If the signal output from the sensor 130 is an analog signal, the data interface 305 may include an analog-to-digital converter (not shown) to convert the signals. Alternatively, where transceiver 135 and sensor 130 communicate using digital signals, transceiver 135 may include a digital interface (not shown) that communicates with the data interface 305 and the sensor 130.

Figure 2:
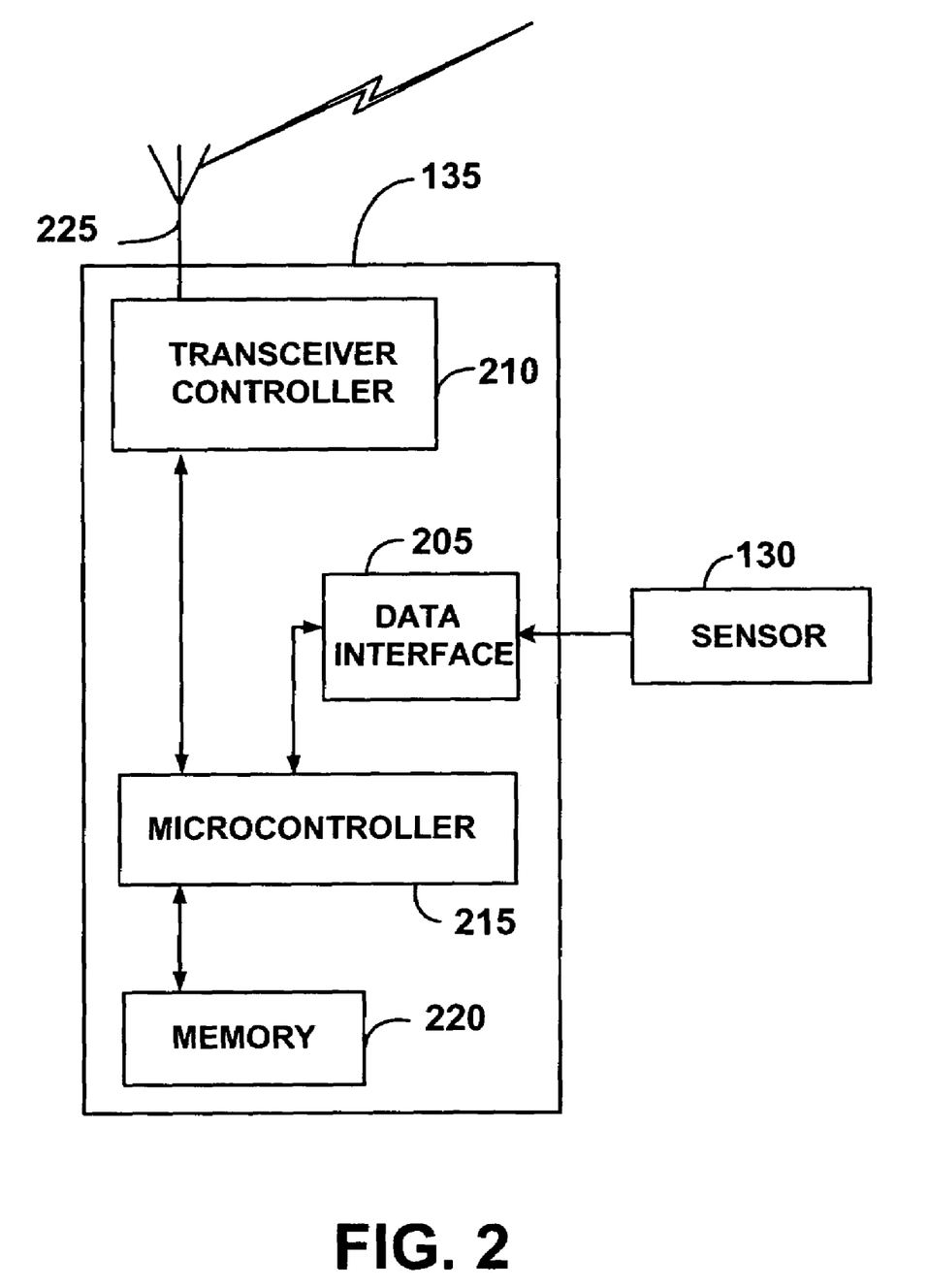
FIG. 2 is a block diagram illustrating one of a number of embodiments of the transceiver in FIG. 1 in communication with the sensor of FIG. 1.

As illustrated in FIG. 2, the sensor 140 may be in communication with the transceiver 135. Transceiver 135 may comprise an RF transceiver controller 210, a data interface 205, a microcontroller 215, a memory 220, and an antenna 225. A data signal forwarded from the sensor 140 may be received by the data interface 205. In those situations where the data interface 205 has received an analog data signal, the data interface 205 may be configured to convert the analog signal into a digital signal before forwarding a digital representation of the data signal to the data controller 215. In one embodiment, each transceiver 135 may be configured with a memory 220 that stores a unique transceiver identifier that identifies the RF transceiver 135.

Transceivers 135 that function in automated monitoring system 100 as both a repeater and an integrated transceiver have two unique addresses. One address indicates messages intended for the repeater; the second address indicates messages for the sensor 140. Data controller 215 evaluates the incoming message to determine which address the message contains, which function is desired, and acts accordingly.

In operation, the RF transceiver 135 receives an incoming message via antenna 225. The transceiver controller 210 receives the incoming message, modifies the received signal, and passes the modified signal onto the microcontroller 215. The microcontroller 215 evaluates the message to determine the intended recipient.

If the intended recipient is the integrated transceiver 135, the microcontroller 215 then prepares the appropriate response as discussed below. This response may include data from the sensor 140. If the intended recipient is the repeater, the microcontroller 215 then prepares the message to be repeated onto the intended recipient according to the message protocol discussed below.

Of course, additional and/or alternative configurations may also be provided by a similarly configured transceiver 135. For example, a similar configuration may be provided for a transceiver 135 that is integrated into, for example, a carbon monoxide detector, a door position sensor, etc. Alternatively, system parameters that vary across a range of values may be transmitted by transceiver 135 as long as data interface 205 and microcontroller 215 are configured to apply a specific code that is consistent with the input from sensor 140. Automated monitoring system 100 may enable the target parameter to be monitored. The transceiver 135 may be further integrated with an actuator (not shown). This provides the ability to remotely control systems such as HVAC systems, lighting systems, etc. via the applications server 110 (FIG. 1). Further information regarding use of actuators in automated monitoring system 100 may be found in commonly assigned U.S. Pat. No. 6,914,533, entitled "System and Method for Monitoring and Controlling Remote Devices," and issued on Jul. 5, 2005, which is hereby incorporated in its entirety by reference.

One of ordinary skill in the art will appreciate that the various communication devices in automated monitoring system 100 may be configured with a number of optional power supply configurations. For example, a personal mobile transceiver may be powered by a replaceable battery. Similarly, a repeater may be powered by a replaceable battery that may be supplemented and/or periodically charged via a solar panel. These power supply circuits, therefore, may differ between communication device depending upon the devices being monitored, the related actuators to be controlled, the environment, and the quality of service required. In the case of a transceiver acting as both a repeater and a remote monitoring device, the transceiver may be independently powered so as not to drain the sensor or actuator. Those skilled in the art will appreciate how to meet the power requirements of the various communication devices. As a result, it is not necessary to further describe a power supply suitable for each communication device and each application in order to appreciate the concepts and teachings of the present invention.

As stated above, automated monitoring system 100 may be used in a variety of environments to monitor and/or control any of a variety of types of sensors 140 and sensors/actuators 130. As described above, in one embodiment automated monitoring system 100 may provide remote monitoring of the electricity consumption of an electric meter. In this regard, FIG. 2 illustrates a schematic diagram of one of a number of embodiments of an electric meter 200 in communication with a communication device, such as a transceiver 135 or repeater 125. Transceiver 135 may be configured and may operate in a similar manner as described with respect to FIG. 2. Where transceiver 135 is in communication with an electric meter 300, transceiver 135 may comprise specific logic related to electric meter 300. For example, in one of a number of embodiments, transceiver 135 may further comprise logic configured to receive data from electric meter 300, retrieve the unique identifier from 220, and generate a transmit message using a predefined communication protocol being implemented by the wireless communication network, which is described in detail below. Nonetheless, one of ordinary skill in the art will appreciate that various other communication protocols may be used in accordance with the present invention.

The data received from electric meter 300 may be related to the electricity consumption of electric meter 300. Depending on the specific implementation of electric meter 300, the data may be formatted in a variety of ways. For example, as stated above, the data received by data interface 205 may be an analog or a digital signal. Electric meter 300 may be an electromechanical device configured to measure electricity consumption using a meter wheel. In this embodiment, the electric meter 300 may provide data associated with the total number of rotations of the meter wheel within a predefined period of time. One of ordinary skill in the art will appreciate that electric meter 300 may be configured in a variety of other ways to measure the electricity consumption of the load. Regardless the specific configuration of electric meter 300, data interface 205 is configured to receive the data related to the electricity consumption of electric meter 300.

The transmit message generated may comprise the unique identifier stored in memory 220 and the data related to the electricity consumption of the electric meter 300. As described above, the transmit message may be formatted in the message structure described below. More importantly, the transmit message may be configured such that the transmit message may be received by the site controller 150 via the wireless communication network and such that the site controller 150 may identify the electric meter 300 and notify applications server 110 of the transmit message.

One of ordinary skill in the art will appreciate that the logic described above, may be implemented in hardware, software, firmware, or a combination thereof. As illustrated in FIG. 3, in one of a number of possible embodiments, the logic is implemented in software or firmware that is stored in memory 220 and that is executed by microcontroller 215. Memory 220 may include one or more If implemented in hardware, as in alternative embodiments, the logic may be implemented in any one or combination of volatile memory elements (e.g., random access memory (RAM, such as DRAM, SRAM, SDRAM, etc.)) and nonvolatile memory elements (e.g., ROM, hard drive, tape, CDROM, etc.). Memory 220 may incorporate electronic, magnetic, optical, and/or other types of storage media. Memory 220 may also have a distributed architecture, where various components are situated remote from one another. If implemented in hardware, as in alternative embodiments, the logic may be implemented with any or a combination of the following technologies, which are all well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

Furthermore, one of ordinary skill in the art will appreciate that the integration of electric meter 300 and transceiver 135 may be accomplished in a variety of ways. For example, in one embodiment, transceiver 135 may be included within electric meter 300 as part of its internal configuration. In other embodiments, transceiver 135 may be externally attached to the electric meter. In further embodiments, transceiver 135 may be installed in close proximity to the electric meter 300 where transceiver 135 and electric meter 300 communicate via a wired or wireless connection.

Referring again to FIG. 3, during normal operation, transceiver 135 may receive a command message on antenna 225 via a message protocol. The command message may be initiated from site controller 150, applications server 110, laptop 155, workstation 160, or any other device connected to WAN 120. In this manner, the command message may be used to request data related to the electricity consumption of a particular electric meter 300. Microcontroller 215 may evaluate the received message to determine if the "to" address is its own unique address. If it is, then the microcontroller 215 evaluates the command and prepares a response message.

In response to the command message, microcontroller 215 receives the data related to the electricity consumption of the electric meter 300. In one embodiment, the data related to the electricity consumption may be retrieved by initiating a request to the electric meter 300. In another embodiment, the data may be stored in memory 220, in which case microcontroller 215 retrieves the data from memory 220. Microcontroller 215 may also retrieve the unique address from memory 220. Then, the microcontroller 215 formats a transmit signal in response to the command message as described above. Microcontroller 215 then communicates the transmit signal to transceiver controller 210, which provides the transmit signal to the wireless communication network. The transmit signal may be delivered to the site controller 150. Depending on where the command message was generated, the transmit signal may be forwarded to applications server 110, laptop 155, workstation 160, a computing device operated by a user, or any other device connected to WAN 120.

Of course, additional and/or alternative configurations may also be provided by a similarly configured transceiver. For example, a similar configuration may be provided for a transceiver that is integrated into, for example, a carbon monoxide detector, a door position sensor, etc. Alternatively, system parameters that vary across a range of values may be transmitted by transceiver 135 as long as data interface 205 and microcontroller 215 are configured to apply a specific code that is consistent with the input from sensor 140. As long as the code is known by the application server 110 or workstation 160, the target parameter may be monitored with the present invention. The RE transceiver 135 may be further integrated with an actuator. This would provide the user with the ability to remotely control systems such as HVAC systems, lighting systems, etc. remotely via the applications server 260. Further information regarding the integration of an actuator can be found in U.S. Pat. No. 6,914,533, "System and Method for Monitoring and Controlling Remote Devices," issued on Jul. 5, 2005, commonly assigned and incorporated in its entirety herein by reference.

It will be appreciated by persons skilled in the art that the various RF communication devices illustrated and described may be configured with a number of optional power supply configurations. For example, a personal mobile transceiver may be powered by a replaceable battery. Similarly, a stand-alone RF transceiver/repeater may be powered by a replaceable battery that may be supplemented and/or periodically charged via a solar panel. These power supply circuits, therefore, may differ between RF communication devices depending upon the devices being monitored, the related actuators to be controlled, the environment, and the quality level of service required. In the case of an RF transceiver acting as both a repeater and a remote monitoring device, the RF transceiver may be independently powered so as not to drain the sensor or actuator. Those skilled in the art will appreciate the various power requirements of the various RF communication devices. As a result, it is not necessary to further describe a power supply suitable for each RF communication device and each application in order to appreciate the concepts and teachings of the present invention.

Figure 4:
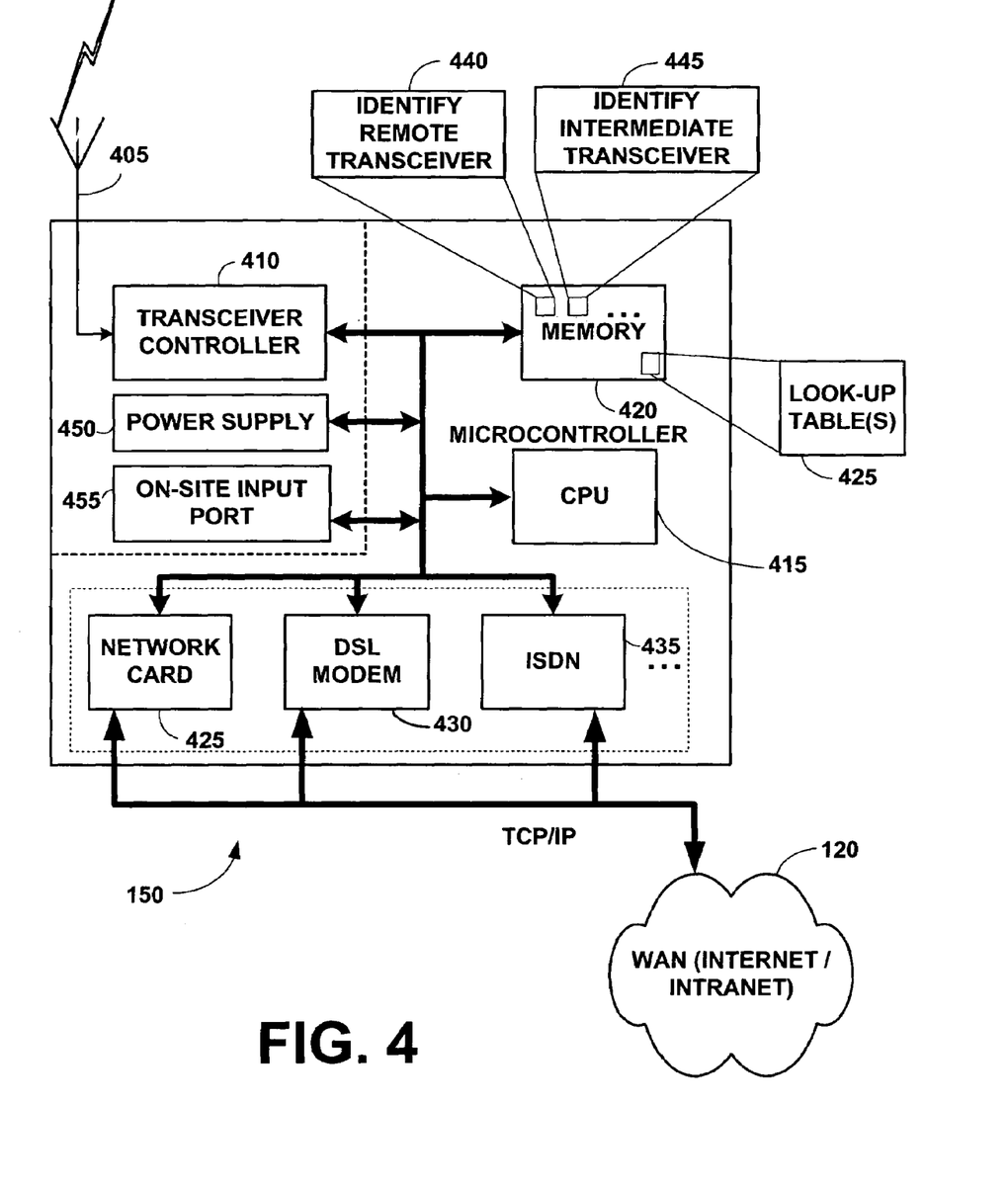
FIG. 4 is a block diagram illustrating one of a number of possible embodiments of the site controller of FIG. 1.

Having illustrated and described the operation of the various combinations of communication devices with the sensor 140 and sensor/actuators 130 (FIG. 1), reference is now made to FIG. 4, which is a block diagram further illustrating one embodiment of a site controller 150. A site controller 150 may comprise an antenna 405, a transceiver controller 410, a central processing unit (CPU) 415, memory 420, a network interface device, such as a network card 425, a digital subscriber line (DSL) modem 430, an integrated services digital network (ISDN) interface card 435, as well as other components not illustrated in FIG. 4, which may be configured to enable a TCP/IP connection to the WAN 120 (FIG. 1). Site controller 150 may also include a power supply 450 for powering the site controller 150. The power supply 450 may be one of many known power supplies. In addition, the site controller 150 may include an on-site input port 455, which allows a technician to communicate directly with site controller 150. Further information regarding the function, operation, and architecture of the site controller 150 may be found in commonly assigned U.S. patent application Ser. No. 09/925,786, entitled, "System and Method for Controlling Communication Between a Host Computer and Communication Devices Associated with Remote Devices in an Automated Monitoring System," which is hereby incorporated in its entirety by reference.

The transceiver controller 410 may be configured to receive incoming transmissions via the antenna 405. Each of the incoming transmissions are consistently formatted in the message protocol as described below. The site controller 150 may be configured such that the memory 420 includes a look-up table 425 configured for identifying the various remote and intermediate communication devices used in generating and transmitting the received data transmission. As illustrated in FIG. 4, site controller 150 may include an "Identify Remote Transceiver" memory sector 440 and an "Identify Intermediate Transceiver" memory sector 445. Programmed or recognized codes within memory 425 may also be provided and configured for controlling the operation of a CPU 415 to carry out the various functions that are orchestrated and/or controlled by the site controller 150. For example, memory 420 may include program code for controlling the operation of the CPU 415 to evaluate an incoming data packet to determine what action needs to be taken. In this regard, one or more look-up tables 425 may also be stored within the memory 420 to assist in this process. Furthermore, the memory 420 may be configured with program code configured to identify a remote transceiver or identify an intermediate RF transceiver. Function codes and RF transmitter and/or RF transceiver identifiers may all be stored with associated information within the look-up tables 425.

Thus, one look-up table 425 may be provided to associate transceiver identifications with a particular user. Another look-up table 425 may be used to associate function codes associated with the message protocol. For example, a look-up table 425 may include a unique code designating various functions, such as test, temperature, smoke alarm active, security system breach, etc. In connection with the lookup table(s) 425, the memory 420 may also include a plurality of code segments that are executed by the CPU 415, which may in large part control operation of the site controller 150. For example, a first data packet segment may be provided to access a first lookup table to determine the identity of the transceiver that transmitted the received message. A second code segment may be provided to access a second lookup table to determine the proximate location of the transceiver that generated the message. A third code segment may be provided to identify the content of the message transmitted (not shown). Namely, is it a fire alarm, a security alarm, an emergency request by a person, a temperature control setting, etc. In accordance with the present invention, additional, fewer, or different code segments may be provided to carry out different functional operations and data signal transfers.

The site controller 150 may also include one or more network interface devices to facilitate via WAN 120. For example, the site controller 150 may include a network card 425, which may allow the site controller 150 to communicate across a local area network to a network server. This network server may function as a backup site controller 150 to the WAN 120. Alternatively, the site controller 150 may contain a DSL modem 430, which may be configured to provide a link to a remote computing system by way of the public switched telephone network (PSTN). In yet another embodiment, the site controller 150 may include an ISDN card 435 configured to communicate via an ISDN connection with a remote system. One of ordinary skill in the art will appreciate that various other communication interfaces may be provided to serve as primary and/or backup links to the WAN 120 (FIG. 1) or to local area networks that might serve to permit local monitoring of the status of the site controller 150 and for data packet control.

Figure 5:
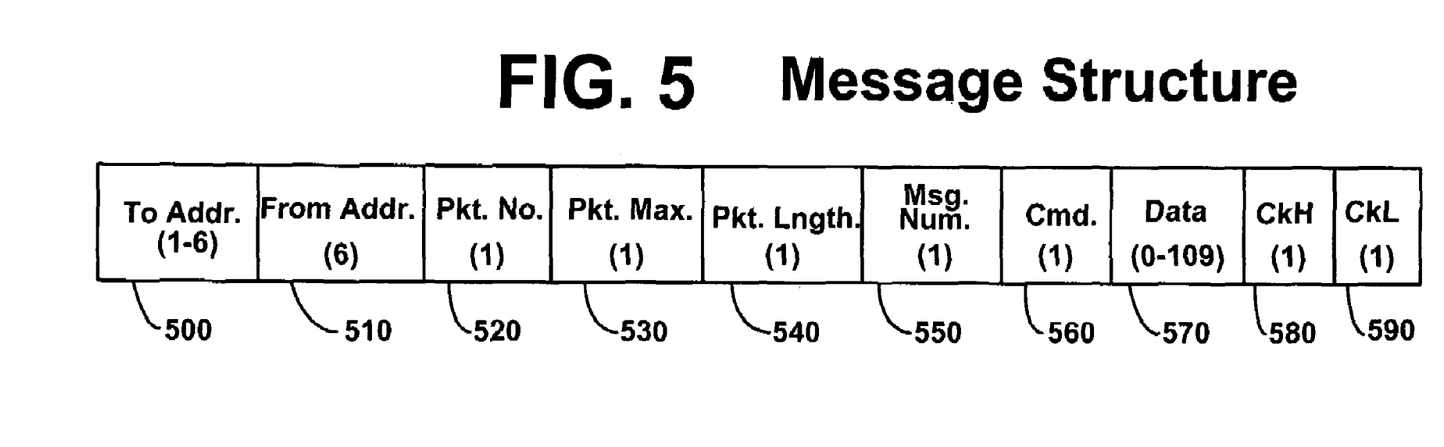
FIG. 5 is a table illustrating an embodiment of a message structure for a communication protocol according to the present invention that may be used for communicating between the site controller and transceivers of FIG. 1.

Communication between the site controller 150 and the communication devices within coverage area 165 may be implemented using a data packet protocol according to the present invention. FIG. 5 sets forth one embodiment of a message structure for the data packet protocol of the present invention. Messages transmitted within the automated monitoring system 100 may consist of a "to" address 500, a "from" address 510, a packet number 520, a number of packets in a transmission 530, a packet length 540, a message number 550, a command number 560, data 570 (if applicable), and a check sum error detectors (CKH 580 and CKL 590).

The "to" address 500 indicates the intended recipient of the packet. This address can be scalable from one to six bytes based upon the size and complexity of automated monitoring system 100. By way of example, the "to" address 500 may indicate a general message to all transceivers, to only the repeaters, or to a single integrated transceiver. In a six byte "to" address 500, the first byte indicates the transceiver type—to all transceivers, to some transceivers, or a specific transceiver. The second byte may be the identification base, and bytes three through six may be used for the unique transceiver address (either stand-alone or integrated). The "to" address 500 may be scalable from one byte to six bytes depending upon the intended recipient(s).

The "from" address 510 identifies the transceiver originating the transmission and may be a six-byte unique address. The "from" address 510 may be the address of the site controller 150 (FIG. 1) when the site controller 150 (FIG. 1) requests data, or this may be the address of the integrated transceiver responding to a request for information from the site controller 150 (FIG. 1).

The packet number 520, the packet maximum 530, and the packet length 540 may be used to concatenate messages that are greater than a predetermined length. The packet maximum 530 indicates the number of packets in the message. The packet number 520 may be used to indicate a packet sequence number for a multiple-packet message.

The message number 550 may be assigned by the site controller 150. Messages originating from the site controller 150 may be assigned an even number, while responses to the site controller 150 may have a message number equal to the original message number plus one. Thus, the site controller 150 may increments the message number 550 by two for each new originating message. This may enable the site controller 150 to coordinate the incoming responses to the appropriate command message.

The command number 560 may designate a specific data request from the receiving device. One of ordinary skill in the art will appreciate that, depending on the specific implementation of automate monitoring system 100, the types of commands may differ. In one embodiment, there may be two types of commands: device specific and non-device specific. Device specific commands may control a specific device such as a data request or a change in current actuator settings. Commands that are not device specific may include, but are not limited to, a ping, an acknowledge, a non-acknowledgement, downstream repeat, upstream repeat, read status, emergency message, and a request for general data to name a few. General data may include a software version number, the number of power failures, the number of resets, etc.

The data field 570 may contain data as requested by a specific command. The requested data may be any value. By way of example, test data can preferably be encoded in ASCII (American Standard Code for Information Interchange) or other known encoding systems as known in the art. The data field 570 of a single packet may be scalable up to a predetermined length. When the requested data exceeds the predetermined length, the data controller of transceiver 135 may divide the data into an appropriate number of sections and concatenates the series of packets for one message using the packet identifiers as discussed above.

While specific byte lengths for sections of the message are being set forth, it would be obvious to one of ordinary skill in the art to vary the byte lengths based upon system needs. Less complex systems, etc. could use smaller sized sections, whereas more complex systems could increase the byte lengths.

Checksum fields 580 and 590 may be used to detect errors in the transmissions. In one embodiment, any error can be detected via cyclic redundancy check sum methodology. This methodology treats the message as a large binary number and divides the binary number by a generating polynomial (such as CRC-16). The remainder of this division is then sent with the message as the checksum. The receiver then calculates a checksum using the same methodology and compares the two checksums. If the checksums do not match, the packet or message will be ignored. While this error detection methodology is preferred, one of ordinary skill in the art will appreciate that other error detection systems may be implemented.

As stated above, automated monitoring system 100 may employ wireless and/or wired communication technologies for communication between site controller 150 and the various communication devices. In one embodiment, communication between site controller 150 and the communication devices may be implemented via an RF link at a basic rate of 4,800 bits per second (bps) and a data rate of 2400 bps. All the data may be encoded in the Manchester format such that a high to low transition at the bit center point represents a logic zero and a low to high transition represents a logic one. One of ordinary skill in the art will appreciate that other RF formats may be used depending upon design needs. By way of example, a quadature phase shift encoding method may be used, thereby enabling automated monitoring system 100 to communicate via hexadecimal instead of binary.

While the message indicates specific byte length for each section, only the order of the specific information within the message is constant. The byte position number in individual transmissions may vary because of the scalability of the "to" address 500, the command byte 560, and the scalability of the data 570.

The message may further include a preface and a postscript (not shown). The preface and postscripts are not part of the message body but rather serve to synchronize the control system and to frame each packet of the message. The packet begins with the preface and ends with a postscript. The preface may be a series of twenty-four logic ones followed by two bit times of high voltage with no transition. The first byte of the packet can then follow immediately. The postscript may be a transition of the transmit data line from a high voltage to a low voltage, if necessary. It may be less desirable to not leave the transmit data line high after the message is sent. It would be obvious to one of ordinary skill in the art to modify the preface and the postscript as necessary based on specific design needs.

Returning to FIG. 1, the repeater 125 acts as a communications bridge between a remote device and the site controller 150 when the remote device cannot reliably communicate directly with the site controller 150. In this manner, the repeater 125 may communicate in two or more modes: normal, emergency, etc.

Figure 6:
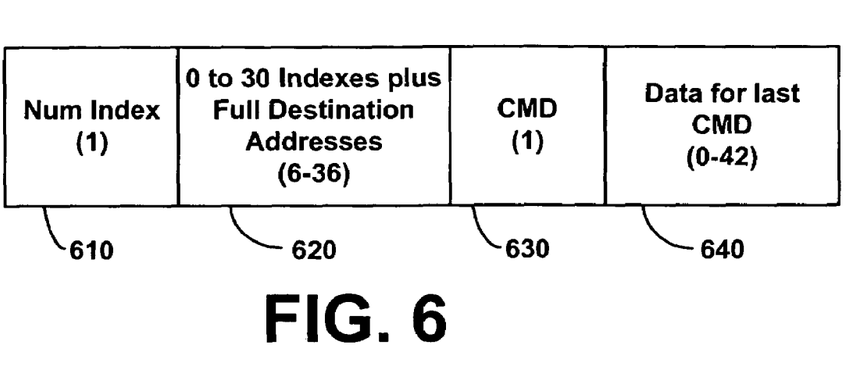
FIG. 6 is a table illustrating the data section of a downstream message in accordance with the message protocol of FIG. 5.

For example, during normal communication, the repeater 125 may have two functions: repeating messages (including repeating upstream messages) and repeating downstream messages. Upstream messages are transmissions to another repeater 125 or remote device. Downstream messages are transmissions to another repeater 125 or site controller 150. Responding to common messages involves taking the appropriate action and sending a response to the site controller 150. The repeater 125 may modify the message depending upon the stream direction. An exemplary format for the data field 570 for a downstream repeated message is set forth in FIG. 6. For instance, the data field 570 may have a "Num Index" 610, which may identify the number of indexes being sent with the downstream repeat. The indexes 620 may contain the downstream path including the intended recipient address. The "CMD" field 630 may identify the particular command for the intended receiving device. The "Data for last CMD" field 640 may include either an index table of downstream addresses or upstream addresses.

Figure 7:
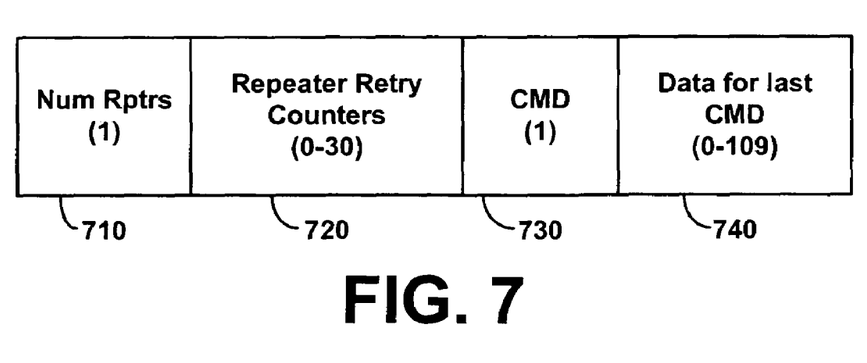
FIG. 7 is a table illustrating the data section of an upstream message in accordance with the message protocol of FIG. 5.

FIG. 7 sets forth an example of the structure for the data field 570 of an upstream message. The "number of repeaters" 710 may indicate the number of upstream repeaters. The "Repeater Retry Counters" 720 may indicate the number of retries by each repeater in the upstream. The "CMD" field 730 may indicate the command sent to the intended remote device. The "Data for last CMD" 740 may indicate the data in response to the original command from the intended remote device.

Examples of commands that are sent directly from the site controller 150 to the repeater 125 include load upstream addresses. This command causes the repeater 125 to store the addresses to which the repeater 125 sends messages when communicating upstream. The loading of the upstream addresses also initiates a transceiver functioning as a repeater 125. The response to a load command may be a status message that is sent to the site controller 150.

Another example of a communication mode is emergency mode. In this mode, emergency messages are automatically transmitted upstream regardless of what other actions may be taking place. Unlike normal communications, emergency messages are sent unsolicited from the integrated transceiver 135 to the site controller 150.

During all modes of communication, each of the communication devices may expect a response message to all messages sent. There may be at least two acknowledgements: a positive acknowledgement, a negative acknowledgement, etc. The positive acknowledgement may be sent whenever a message is received and understood. A negative acknowledgement may be sent whenever the message is not received and understood correctly or whenever an expected message is not received. A negative acknowledgment may be followed by a predetermined number of retries.

Automated monitoring system 100 may be adapted to monitor and apply control signals in an unlimited number of applications. By way of example only, communication devices according to the present invention may be adapted for use with pay type publicly located telephones, cable television set converter boxes, personal security systems, electric utility meters, as well as, for use with a variety of other appliances and devices.

In a geographic area appropriately networked with permanently located repeaters 125, personal transceivers (not shown) may be used to monitor and control personnel access and egress from specific rooms or portions thereof within a controlled facility. Personal transceivers may be further configured to transfer personal information to public emergency response personnel, to transfer personal billing information to vending machines, or to monitor individuals within an assisted living community.

Transceivers according to the present invention may also be integrated to monitor and control a host of industrial and business applications as well. By way of example only, building automation systems, fire control systems, alarm systems, industrial trash compactors, and building elevators may be monitored and controlled with such devices. In addition, courier drop boxes, time clock systems, automated teller machines, self-service copy machines, and other self-service devices may be monitored and controlled as appropriate. By way of further example, a number of environment variables that require monitoring may be integrated with the system of the present invention to permit remote monitoring and control. For instance, light levels in the area adjacent to automated teller machines must meet minimum federal standards. Also, the water volume transferred by water treatment plant pumps, smokestack emissions from a coal burning power plant or a coke fueled steel plant oven may be remotely monitored.

The transceivers using the packet message protocol of the present invention may be further integrated with a voice-band transceiver. As a result, when a person presses, for example, the emergency button on his/her transmitter, medical personnel, staff members, or others may respond by communicating via two-way radio with the party in distress. In this regard, each transceiver may be equipped with a microphone and a speaker that would allow a person to communication information such as their present emergency situation, their specific location, etc.

Figure 8:
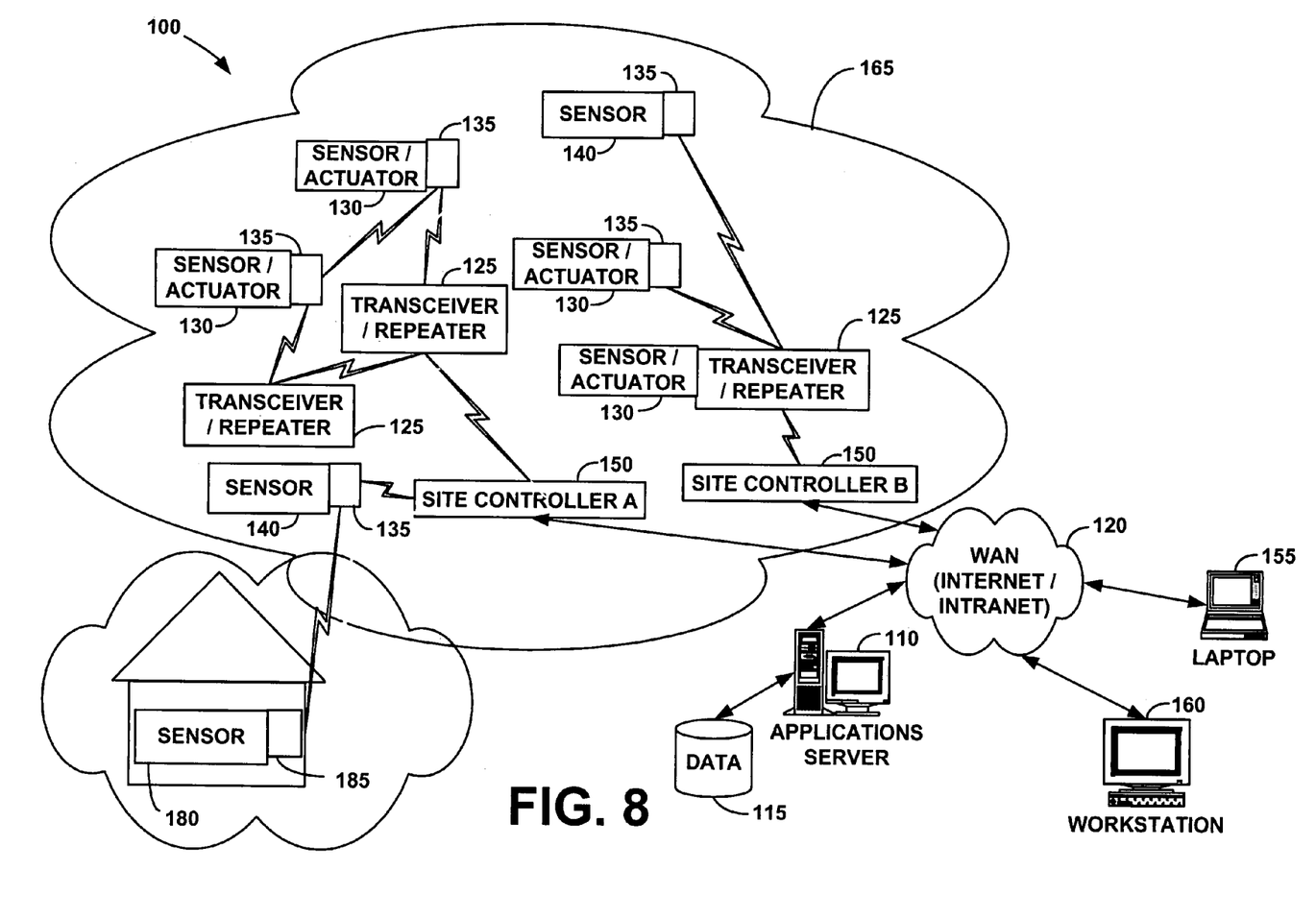
FIG. 8 is a block diagram illustrating another embodiment of an automated monitoring system according to the present invention for providing remote monitoring of electricity consumption for an electric meter.

FIG. 8 sets forth another embodiment of an automated monitoring system 100 according to the present invention. Automated monitoring system 100 of FIG. 1 is shown with an additional sensor 180 and transceiver 185. The additional sensor 180 and transceiver 185 are shown to be communicating with, but outside of, the coverage area 165. In this example, the additional sensor 180 and transceiver 185 may be placed outside of the original control system. In order to communicate, the coverage area of transceiver 185 need only overlap the coverage area 165. By way of example only, the original installation may be an automated monitoring system 100 that monitors electricity usage via the utility meters in an apartment complex. Later a neighbor in a single family residence nearby the apartment complex may remotely monitor and control their thermostat by installing a sensor/actuator transceiver according to the present invention. The transceiver 185 then communicates with the site controller 150 of the apartment complex. If necessary, repeaters (not shown) may also be installed to communicate between the transceiver 185 and the apartment complex site controller 150. Without having the cost of the site controller 150, the neighbor may enjoy the benefits of the control system.

The foregoing description has been presented for purposes of illustration and description. It is not intended to be exhaustive or to limit the invention to the precise embodiments disclosed. Obvious modifications or variations are possible in light of the above teachings. When the transceiver is permanently integrated into an alarm sensor other stationary device within a system, then the control system server and/or site controller could be configured to identify the transceiver location by the transceiver identification number alone. It will be appreciated that, in embodiments that do not utilize stand-alone transceivers, the transceivers will be configured to transmit at a higher RF power level in order to effectively communicate with the site controller 150.

It will be appreciated by those skilled in the art that the information transmitted and received by the wireless transceivers of the present invention may be further integrated with other data transmission protocols for transmission across telecommunications and computer networks. In addition, it should be further appreciated that telecommunications and computer networks can function as a transmission path between the networked wireless transceivers, the site controller 150, and the applications server 110.

What is claimed is:

1. A communication device adapted for use in an automated monitoring system for providing remote monitoring of commodity consumption, the automated monitoring system comprising a data controller in communication with a plurality of commodity meters via a wireless communication network and in communication with a host computer via a wide area network, the communication device comprising:
    a data interface configured to receive data related to the commodity consumption measured by the commodity meter;
    memory comprising a unique identifier corresponding to the commodity meter;
    logic configured to receive the data related to the commodity consumption measured by the commodity meter, retrieve the unique identifier corresponding to the commodity meter, and generate a transmit message comprising the unique identifier and the data related to the commodity consumption measured by the commodity meter and configured such that the transmit message may be received by the data controller via the wireless communication network and such that the data controller may identify the commodity meter;
    a wireless transceiver configured for communication over the wireless communication network and configured to provide the transmit message to the wireless communication network and receive messages from the wireless communication network; and
    logic configured to receive a transmit message from another communication device and retransmit the received transmit message.

2. The communication device of claim 1, wherein the data controller further communicates data from the transmit message to the host computer via the wide area network.

3. The communication device of claim 1, wherein the data controller further communicates with the host computer via the wide area network one or more messages containing data from the transmit message.

4. The communication device of claim 1, wherein the wireless transceiver transmits and received communications at 900 MHz.

5. The communication device of claim 1, wherein the commodity meter is an electric meter.

6. The communication device of claim 1, wherein the commodity meter is a gas meter.

7. The communication device of claim 1, wherein the commodity meter is a water meter.

8. A communication device adapted for use in an automated monitoring system for providing remote monitoring of commodity consumption events, the automated monitoring system comprising a data controller in communication with a plurality of commodity meters via a wireless communication network and in communication with a host computer via a wide area network, the communication device comprising:
    a data interface configured to receive data related to the commodity consumption events detected by a commodity meter electrically coupled to the communication device;
    memory comprising a unique identifier corresponding to the commodity meter;
    logic configured to receive the data related to the commodity consumption events detected by the commodity meter electrically coupled to the communication device, retrieve the unique identifier corresponding to the commodity meter electrically coupled to the communication device, and generate a transmit message using predetermined communication protocol, the transmit message including the unique identifier and the data related to the commodity consumption events detected by the commodity meter electrically coupled to the communication device and configured such that the transmit message may be received by the data controller via the wireless communication network;
    a wireless transceiver configured for communication over the wireless communication network and configured to provide the transmit message to the wireless communication network and receive messages from the wireless communication network; and
    logic configured to receive a transmit message from another communication device and retransmit the received transmit message.

9. The communication device of claim 8, wherein the predetermined communication protocol of the transmit message is the same communication protocol implemented by the data controller in communicating with the host computer via the wide area network.

10. The communication device of claim 9, wherein the predetermined communication protocol of the transmit message is TCP/IP.

11. The communication device of claim 8, wherein the wireless transceiver transmits and receives communications at a radio frequency of 900 MHz.

12. The communication device of claim 8, wherein the commodity meter is an electric meter.

13. The communication device of claim 8, wherein the commodity meter is a gas meter.

14. The communication device of claim 8, wherein the commodity meter is a water meter.

15. The communication device of claim 8, wherein one of the commodity consumption events is an interruption in consumption of the commodity.

16. The communication device of claim 8, wherein one of the commodity consumption events is a quantity of commodity consumption over a predetermined time period.

17. A site controller adapted for use in an automated monitoring system for providing remote monitoring of commodity consumption, the automated monitoring system comprising a site controller in communication with a plurality of communication devices coupled to commodity meters via a wireless communication network and in communication with a host computer via a wide area network, the site controller comprising:
    a processor configured to execute instructions related to remote monitoring of commodity consumption and communicate with the host computer via the wide area network;
    memory comprising instructions executable by the processor related to remote monitoring of commodity consumption;
    a wireless transceiver configured for communication over the wireless communication network and configured to receive one or more transmit messages repeated by one or more communication devices prior to receipt by the site controller, wherein the one or more transmit messages include commodity consumption measured by a commodity meter and a unique identifier corresponding to the communication device that originated the transmit message; and logic contained in memory and executable by the processor to generate outbound messages to one or more recipient communication devices such that the route of communication includes one or more communication devices that repeat the outbound message to one or more recipient communication device electrically coupled to the commodity meter.

18. The site controller of claim 17, wherein the wireless transceiver transmits and receives communications at a radio frequency of 900 MHz.

19. The site controller of claim 17, further comprising:
a data interface configured to receive data related to the commodity consumption measured by a commodity meter coupled to the site controller.

20. The site controller of claim 19, wherein the commodity meter is an electric meter.

21. The site controller of claim 19, wherein the commodity meter is a gas meter.

22. The site controller of claim 19, wherein the commodity meter is a water meter.

* * * * *